United States Patent
Wu et al.

(10) Patent No.: US 9,627,538 B2
(45) Date of Patent: Apr. 18, 2017

(54) FIN FIELD EFFECT TRANSISTOR AND METHOD OF MANUFACTURING THE SAME

(71) Applicant: UNITED MICROELECTRONICS CORP., Hsinchu (TW)

(72) Inventors: Yen-Liang Wu, Taipei (TW);
Yu-Cheng Tung, Kaohsiung (TW);
Jhen-Cyuan Li, New Taipei (TW);
Shui-Yen Lu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/509,449

(22) Filed: Oct. 8, 2014

(65) Prior Publication Data

US 2016/0005866 A1 Jan. 7, 2016

(30) Foreign Application Priority Data

Jul. 7, 2014 (TW) .............................. 103123281 A

(51) Int. Cl.
*H01L 29/78* (2006.01)
*H01L 29/06* (2006.01)
*H01L 29/66* (2006.01)
*H01L 21/762* (2006.01)

(52) U.S. Cl.
CPC .... *H01L 29/7851* (2013.01); *H01L 21/76224* (2013.01); *H01L 29/0649* (2013.01); *H01L 29/66795* (2013.01); *H01L 29/7848* (2013.01)

(58) Field of Classification Search
CPC . H01L 29/06; H01L 29/7851; H01L 29/0649; H01L 29/66795
USPC .................. 257/288, 290, 308, E21.014
See application file for complete search history.

(56) References Cited

U.S. PATENT DOCUMENTS

| | | | |
|---|---|---|---|
| 8,313,999 B2 | 11/2012 | Cappellani et al. | |
| 8,440,517 B2 | 5/2013 | Lin et al. | |
| 8,497,528 B2 | 7/2013 | Lee et al. | |
| 8,609,497 B2 | 12/2013 | Chung et al. | |
| 8,623,728 B2 | 1/2014 | Chang et al. | |
| 9,214,556 B2 * | 12/2015 | Wann | H01L 29/785 |
| 2005/0224691 A1 * | 10/2005 | Van Arendonk et al. | 250/200 |
| 2008/0299719 A1 * | 12/2008 | Tsuchiaki | 438/197 |
| 2011/0073952 A1 * | 3/2011 | Kwok et al. | 257/368 |
| 2011/0269287 A1 | 11/2011 | Tsai et al. | |
| 2013/0089959 A1 | 4/2013 | Kwok et al. | |
| 2013/0109152 A1 * | 5/2013 | Huang et al. | 438/430 |

(Continued)

*Primary Examiner* — Kimberly Rizkallah
*Assistant Examiner* — Bo Bin Jang
(74) *Attorney, Agent, or Firm* — WPAT, PC; Justin King

(57) ABSTRACT

A fin field effect transistor (FinFET) with improved electrical performance and a method of manufacturing the same are disclosed. A FinFET includes a substrate having a top surface and an insulation. At least a recessed fin is extended upwardly from the top surface of the substrate, and at least a gate stack is formed above the substrate, wherein the gate stack is extended perpendicularly to an extending direction of the recessed fin, and the recessed fin is outside the gate stack. The insulation includes a lateral portion adjacent to the recessed fin, and a central portion contiguous to the lateral portion, wherein a top surface of the lateral portion is higher than a top surface of the central portion. A top surface of the recessed fin is lower than the top surface of the central portion of the insulation.

21 Claims, 9 Drawing Sheets

(56) References Cited

U.S. PATENT DOCUMENTS

| | | |
|---|---|---|
| 2013/0193446 A1 | 8/2013 | Chao et al. |
| 2013/0221447 A1* | 8/2013 | Lee ................ H01L 27/092 257/369 |
| 2014/0008736 A1 | 1/2014 | Li et al. |
| 2014/0246731 A1* | 9/2014 | Chen ............ H01L 21/823481 257/386 |
| 2014/0264604 A1* | 9/2014 | Tsai ................ H01L 29/785 257/347 |
| 2015/0041918 A1* | 2/2015 | Wann et al. ................ 257/401 |

\* cited by examiner

FIN FIELD EFFECT TRANSISTOR AND METHOD OF MANUFACTURING THE SAME

This application claims the benefit of Taiwan application Serial No. 103123281, filed Jul. 7, 2014, the subject matter of which is incorporated herein by reference.

BACKGROUND

Technical Field

The disclosure relates in general to a semiconductor device and a method of manufacturing the same, and more particularly to a fin field effect transistor (FinFET) with improved electrical performance and a method of manufacturing the same.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components of the semiconductor device with defects or improper design would have considerable effects on the electrical properties of the device.

SUMMARY

The disclosure is directed to a fin field effect transistor (FinFET) and a method of manufacturing the same, which is capable of forming separate Epi on the recess fins, thereby improving the electrical performance of the FinFET.

According to the disclosure, a fin field effect transistor (FinFET) is provided, comprising a substrate having a top surface and an insulation formed on the top surface of the substrate. At least a recessed fin is extended upwardly from the top surface of the substrate, and at least a gate stack formed above the substrate, wherein the gate stack is extended perpendicularly to an extending direction of the recessed fin, and the recessed fin is outside the gate stack. The insulation comprises a lateral portion adjacent to the recessed fin, and a central portion contiguous to the lateral portion, wherein a top surface of the lateral portion is higher than a top surface of the central portion. A top surface of the recessed fin is lower than the top surface of the central portion of the insulation.

According to the disclosure, a method for manufacturing a FinFET is disclosed. A substrate having a top surface, at least a recessed fin extending upwardly from the top surface of the substrate, and at least a gate stack formed above the substrate is provided, wherein the gate stack is extended perpendicularly to an extending direction of the recessed fin, and the recessed fin is outside the gate stack. An insulation, comprising a lateral portion adjacent to the recessed fin and a central portion contiguous to the lateral portion, is formed on the top surface of the substrate, and a top surface of the lateral portion is higher than a top surface of the central portion. A top surface of the recessed fin is lower than the top surface of the central portion of the insulation.

Figure 1A:
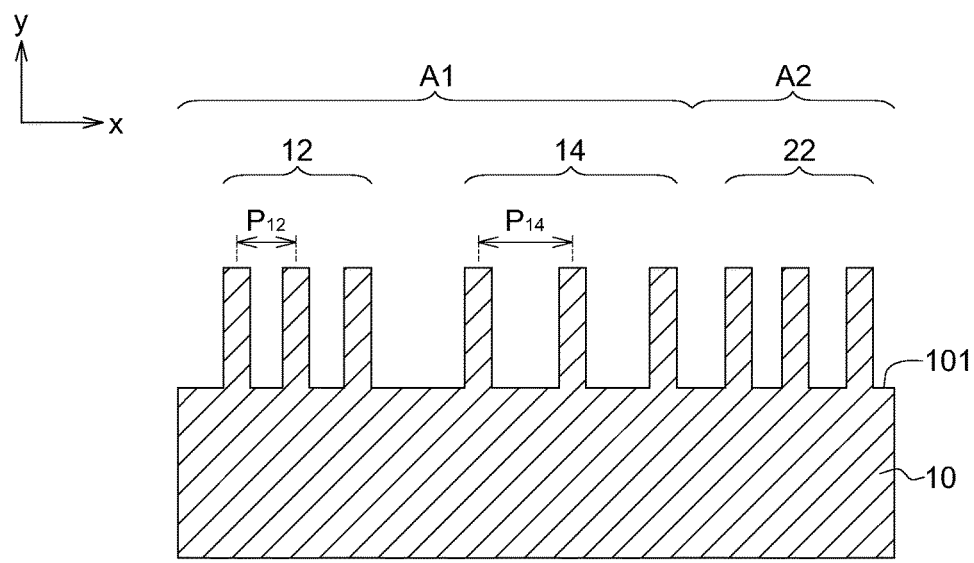
FIG. 1A~FIG. 1G illustrate a method for manufacturing a FinFET according to the first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the present disclosure, a semiconductor device such as a fin field effect transistor (FinFET) and a method for manufacturing the same are provided. According to the embodiments of the present disclosure, an insulation of a FinFET comprises a lateral portion adjacent to the recessed fin, a central portion contiguous to the lateral portion, and a top surface of the lateral portion is higher than a top surface of the central portion. Thus, the problem of conventional schemes suffering from Epi or silicide merging can be effectively prevented, and the electrical performance of the FinFET is consequently improved. Also, the methods of the embodiments could be incorporated in current processes, and they are simple and can be easily conducted under cost-controlled circumstance. Thus, the embodiments have significant contribution to FinFET designed techniques, particular to the FinFET in the trend of size reduction.

The embodiments of the present disclosure can be applied to various types of FinFET, such as n-channel FinFET and p-channel FinFET, and the present disclosure is not limited to the specific type of FinFET. Also, the embodiments of the present disclosure can be applicable to the device having areas with densely-distributed fins and loosely-distributed fins, wherein the gate stacks of the device have been formed on the substrate for wrapping the fins. In the exemplary embodiment, the gate stacks are spaced apart from each other and extended perpendicularly to the extending direction of the fins. For example, a FinFET having the substrate with the first area and the second area is provided, and the densely-distributed and loosely-distributed fins are positioned in the first and second areas, respectively. According to the embodiments, a PMOS area and a NMOS area are illustrated as the first area and the second area, respectively. It is also applicable that a NMOS area and a PMOS area are referred as the first area and the second area, respectively. The present disclosure has no particularly limitation thereto.

Embodiments are provided hereinafter with reference to the accompanying drawings for describing the related configurations and procedures, but the present disclosure is not limited thereto. It is noted that not all embodiments of the invention are shown. The details of the manufacturing method of the embodiments would be different, and could be modified and changed optionally according to the selected procedures in practical applications. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

[First Embodiment]

FIG. 1A~FIG. 1G illustrate a method for manufacturing a FinFET according to the first embodiment of the present disclosure. First, a substrate 10 having a top surface 101 comprises a first area A1 with plural first protruding fins 12 and 14 and a second area A2 with plural second fins 22 are provided. As shown in FIG. 1A, the densely-distributed first protruding fins 12 and the loosely-distributed first protruding fins 14 are positioned in the first area A1, and the second fins 22 are positioned in the second area A2. The phrases of "densely-distributed" and "loosely-distributed" can be defined according to the pitches of the fins. In the embodiment, a pitch P12 of the densely-distributed first protruding fins 12 is smaller than a pitch P14 of the loosely-distributed first protruding fins 14.

Figure 1B:
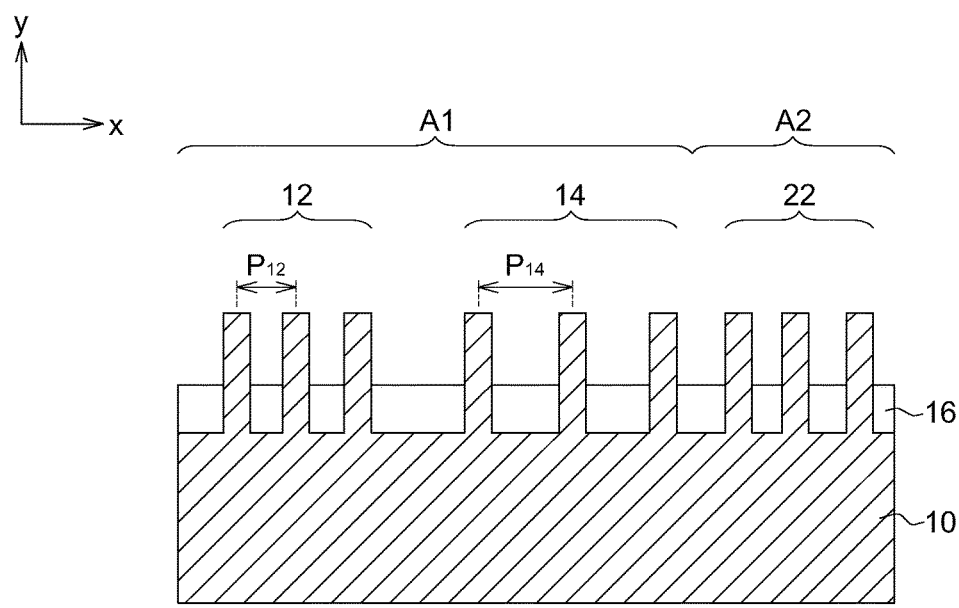

As shown in FIG. 1B, an insulating layer 16 is formed on the top surface 101 of the substrate 10 for isolating the first protruding fins (i.e. densely-distributed first protruding fins 12 and the loosely-distributed first protruding fins 14) and the second fins 22. In one embodiment, a dielectric layer (such as silicon oxide, silicon nitride or other suitable material) can be deposited on the substrate 10 to cover the fins and fully fill the trenches between the fins, followed by chemical mechanical polishing (CMP) for planarizing the dielectric layer and the fins. Then, the dielectric regions between the fins are recessed, so as to form the insulating layer 16 of FIG. 1B.

Figure 6:
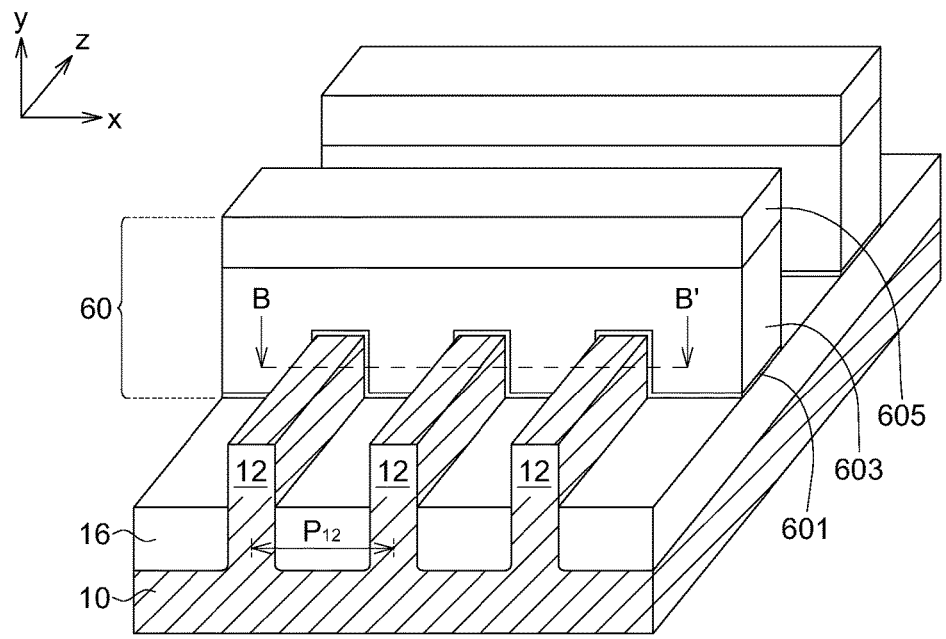
FIG. 6 is a perspective view of a stage of manufacturing the FinFET corresponding to the densely-distributed first protruding fins 12 of FIG. 1B according to the first embodiment of the present disclosure.

Please refer to FIG. 1B and FIG. 6. FIG. 6 is a perspective view of a stage of manufacturing the FinFET corresponding to the densely-distributed first protruding fins 12 of FIG. 1B according to the first embodiment of the present disclosure. The densely-distributed first protruding fins 12 of FIG. 1B are depicted as the cross-sectional view along the cross-sectional line B-B' of FIG. 6. In the exemplary embodiment, the gate stacks 60 are formed on the insulating layer 16 for wrapping the fins, such as the first protruding fins (i.e. densely-distributed first protruding fins 12 and the loosely-distributed first protruding fins 14) and the second fins 22. As shown in FIG. 6, the gate stacks 60 are spaced apart from each other and extended perpendicularly to the extending direction of the fins. For example, the gate stacks 60 are extended along the first direction (i.e. x-direction), while the fins, such as the first protruding fins (i.e. densely-distributed first protruding fins 12 and the loosely-distributed first protruding fins 14) and the second fins 22, are extended along the second direction (i.e. z-direction), and the first direction is perpendicular to the second direction. In one embodiment, each gate stack 60 may comprise a dielectric layer 601, a gate electrode layer 603 and a hard mask layer 605. Also, there is no particular limitation to the types and layers of the gate stacks in the embodiment, and the gate stacks 60 can be retained in the final device, or replaced later by the metal gates (MG), depending on the requirements of the application.

Figure 1C:
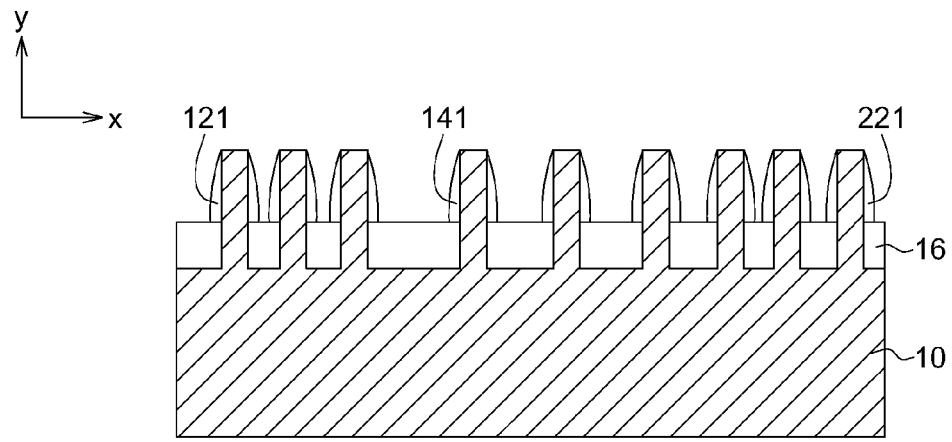
Figure 7:
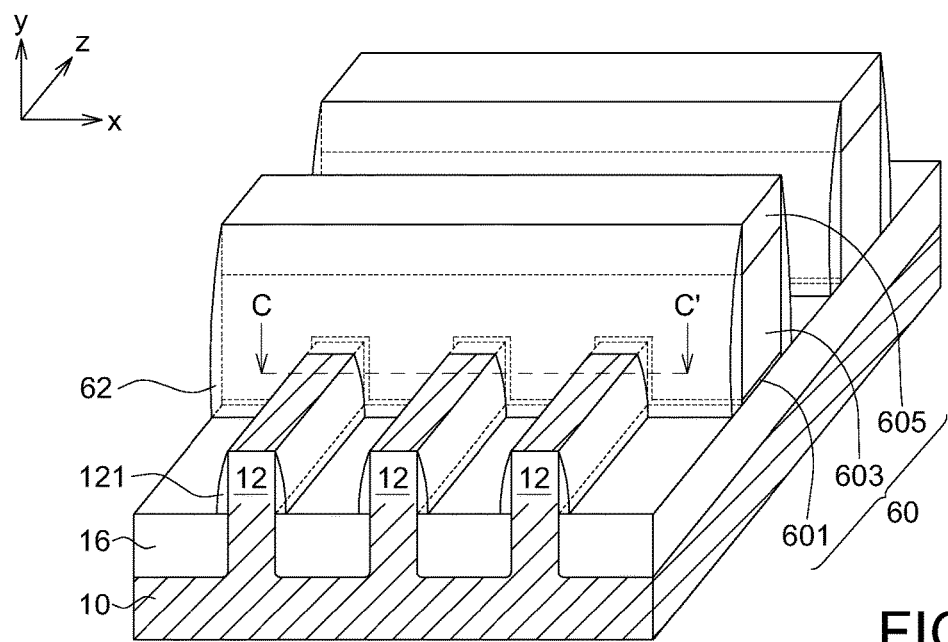
FIG. 7 is a perspective view of a stage of manufacturing the FinFET corresponding to the densely-distributed first protruding fins 12 of FIG. 1C according to the first embodiment of the present disclosure.

After formation of the gate stacks 60, the fin spacers and gate stack spacers 62 are formed on the sidewalls of the fins and the gate stacks 60, respectively. Please refer to FIG. 1C and FIG. 7. FIG. 7 is a perspective view of a stage of manufacturing the FinFET corresponding to the densely-distributed first protruding fins 12 of FIG. 1C according to the first embodiment of the present disclosure. The densely-distributed first protruding fins 12 of FIG. 1C are depicted as the cross-sectional view along the cross-sectional line C-C' of FIG. 7. As shown in FIG. 1C, the first spacers 121 and 141 are respectively formed on the sidewalls of the densely-distributed first protruding fins 12 and the loosely-distributed first protruding fins 14. The second spacers 221 are formed on the sidewalls of the second fins 22. It is noted that the subsequent procedures are described with reference to the cross-sectional view drawings (ex: FIG. 1D~FIG. 1F, FIG. 2A~FIG. 2F, FIG. 3~FIG. 5) for the clear demonstration.

Figure 1D:
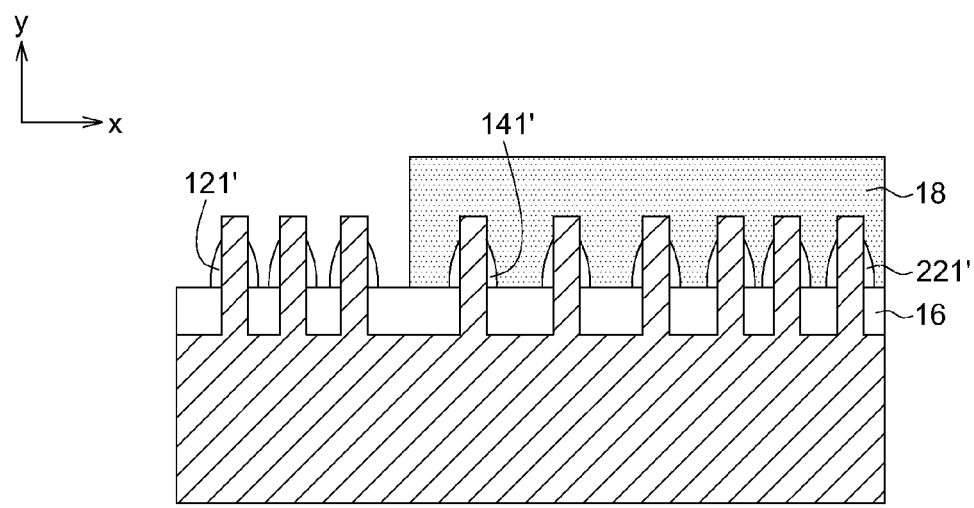

Then, a mask layer 18 is provided for shielding at least the second fins 22 in the second area A2. In the first embodiment, a shrinking step can be further performed for decreasing the height of the spacers. As shown in FIG. 1D, the first spacers 121 and 141 and the second spacers 221 are shrunk, so that the heights of the first spacers 121' and 141' and the second spacers 221' are decreased. Then, the mask layer 18 is applied for covering not only the second fins 22 in the second area A2 but also the loosely-distributed first protruding fins 14 in the first area A1.

Figure 1E:
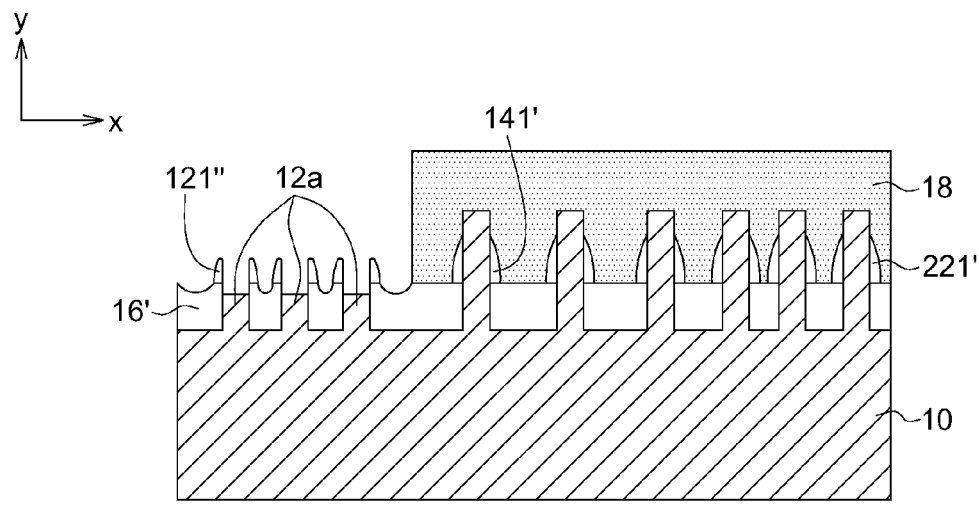

As shown in FIG. 1E, the densely-distributed first protruding fins 12 are recessed (i.e. shortened so as to recess between the portions of the insulation 16' )and the insulating layer 16 is patterned, so as to form the recessed fins (i.e. shortened fins) 12a outside the gate stacks 60 and the insulation 16', respectively. An epitaxial (Epi) layer is grown on the recessed fins 12a. It is noted that height loss of the first spacers 121' may occurs during the fin recessing, and the first spacers 121" adjacent to the recessed fins 12a are denoted after step of fin recessing.

In one embodiment, the portions of the densely-distributed first protruding fins 12 unprotected by the gate stacks 60 are recessed by an etching process, which could be performed under a pressure of about 1 mTorr to 1000 mTorr at a temperature of about 40° C. to 60° C. by using HBr and/or Cl2 as the etch gases, and the etching power could be in a range of about 50 W to 1000 W, and a bias voltage of the etching process could be in a range of about 20 V to 500 V. In other embodiments, the desired profile of the recessed fins 12a can be obtained by tuning the bias voltage to control the etching direction in the etching process.

Figure 1F:
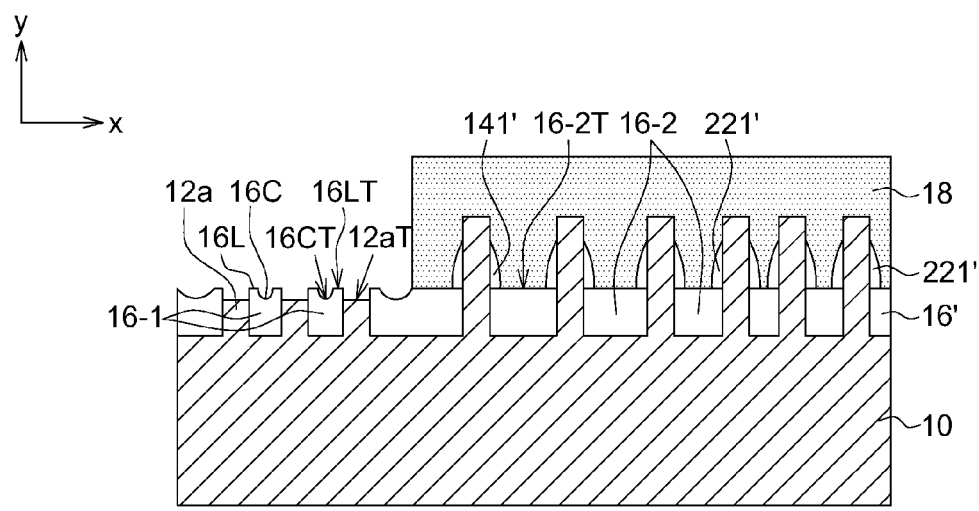

The first spacers 121" can be removed before or after growing the Epi layer. In this exemplified process flow of the first embodiment, the first spacers 121" are removed before growing the Epi layer. As shown in FIG. 1F, the first spacers 121" are removed, so that the recessed fins 12a without the first spacers 121" are formed in a part of the first area A1, while the second spacers 221' and the first spacers 141' shielded by the mask layer 18 are respectively remained on the sidewalls of the second fins 22 and the loosely-distributed first protruding fins 14.

Figure 1G:
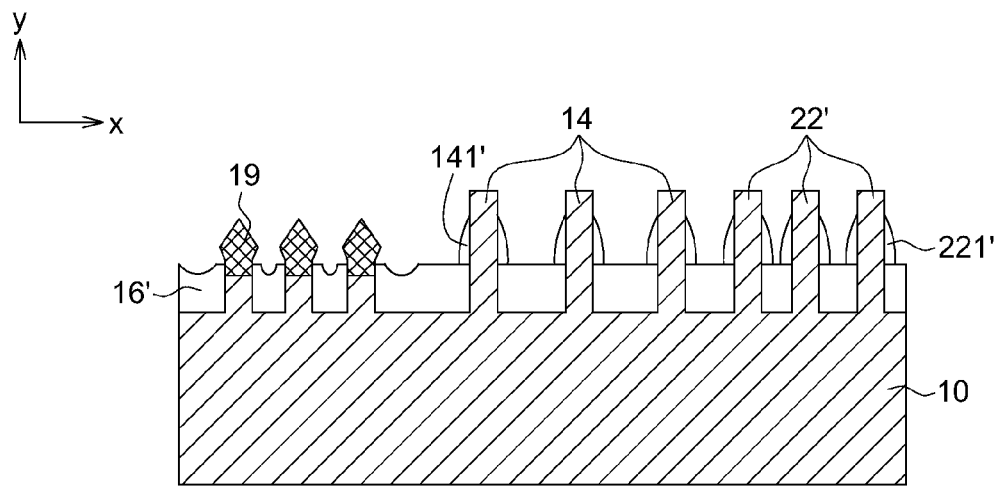

Afterwards, an Epi material (i.e. a strain material), is grown on the recessed fins 12a to form the Epi layers 19, as shown in FIG. 1G. The mask layer 18 is also removed. The Epi layers 19 on the adjacent the recessed fins are spaced apart from each other. The Epi layer 19 may have facets due to different growth rates on different surface planes, as depicted in FIG. 1G. It is noted that other configurations of the Epi layer 19 are also applicable, and the disclosure is not limited thereto. In one embodiment, a strain material is epitaxially grown until the portion of the recessed fins 12a is fully filled, and facets of the Epi layer 19 are substantially fully developed.

The Epi layer 19 may be a single layer structure or a multilayer structure. In one embodiment, the Epi layer 19 comprises a silicon-containing material, and examples of the silicon-containing material include SiP, SiC, or SiGe. In one embodiment of the n-type FinFET, silicon carbon (SiC) can be epi-grown by a LPCVD process to form the Epi layer 19 as the source/drain (S/D) regions of the n-type FinFET, wherein the LPCVD process can be performed at a temperature of about 400° C. to 800° C. under a pressure of about 1 Torr to 200 Torr and using Si3H8 and SiH3CH3 as precursors for reaction. In one embodiment of the p-type FinFET, silicon germanium (SiGe) can be epi-grown by a LPCVD process to form the Epi layer 19 as the S/D regions of the p-type FinFET, wherein the LPCVD process can be performed at a temperature of about 400° C. to 800° C. under a pressure of about 1 Torr to 200 Torr and using SiH4 and GeH4 as precursors for reaction.

Moreover, it is noted that the spacers may be kept under some particular circumstances. For example, it is not necessary to remove the spacers while they are short in height. In one embodiment, when the height (in average) of the first spacers is no more than about 5 nm, the Epi layer 19 can be grown on the recessed fins 12a without removing the first spacers 121".

Please refer to FIG. 1F. The structure manufactured by the embodiment comprises the recessed fins 12a (outside the gate stacks 60) extended upwardly from the top surface 101 of the substrate 10, and an insulation 16' for separating the fins such as the recessed fins 12a, the loosely-distributed first protruding fins 14 and the second fins 22. The insulation 16' comprises a lateral portion 16L adjacent to the recessed fin 12a, and a central portion 16C contiguous to the lateral portion 16L. As shown in an embodied structure of FIG. 1F, a top surface 16LT of the lateral portion 16L is higher than a top surface 16CT of the central portion 16C of the insulation 16'. Also, in one embodiment, a top surface 12aT of the recessed fin 12a is lower than a top surface 16CT of the central portion 16C of the insulation 16'. Practically, configuration of the recessed fin 12a and the insulation 16' may be different for the NMOS and PMOS devices. For example, for a PMOS device manufactured by the embodied method, the top surface 12aT of the recessed fin 12a is lower than the top surface 16CT of the central portion 16C; however, the top surface 12aT of the recessed fin 12a would be higher than the top surface 16CT of the central portion 16C for a NMOS device manufactured by the embodied method. In any cases, due to the configuration of the insulation 16', the epitaxial layers 19 on the adjacent recessed fins can be spaced apart from each other without undesirable merging.

In other words, the insulation 16' outside the gate stacks 60 comprises several first insulating regions 16-1 formed between the adjacent recessed fins 12a at the first area A1, and several second insulating regions 16-2 formed between the adjacent second fins 22 at the second area A2. As depicted in FIG. 1F, the insulation at least comprises a plurality of first insulating regions formed between the adjacent recessed fins at the first area, wherein the top surface 16LT of the lateral portion 16L of one of the first insulating regions 16-1 is higher than the top surface 16CT of the central portion 16C of said first insulating region 16-1, and a top surface 16-2T of the second insulating regions 16-2 is higher than the top surface 16CT of the central portion 16C of the first insulating region 16-1. Also, in one embodiment, the top surface 16-2T of the second insulating regions 16-2 is substantially parallel to the top surface 101 of the substrate 10.

Although the drawings depict that the lateral portion 16L of the first insulating regions 16-1 (of the insulation 16') has a flat top surface 16LT which is substantially parallel to the top surface 101 of the substrate 10, the present disclosure is not limited thereto. The top surface 16LT of the lateral portion 16L can be a convex surface substantially or other profiles, which is affected by the manufacturing conditions. Also, the drawings depict that the central portion 16C substantially presents a concave cross-section; however, the present disclosure is not limited thereto. Other cross-sectional profiles of the central portion 16C such as the reversed trapezoid or arched cross-sectional profiles are also implementable, which is affected by the manufacturing conditions. As long as the lateral portion 16L adjacent to the recessed fin 12a is substantially higher than the central portion 16C of the first insulating regions 16-1 (of the insulation 16'), which facilitates the growing of the Epi material upwardly, the Epi layers 19 grown on the recessed fins 12a can be spaced apart from each other for generating good strain ability. Accordingly, the channel region of the FinFET manufactured by the embodiment of the present disclosure device can be well strained or stressed due to the good strain ability from the separated Epi layers 19, thereby increasing the carrier mobility of the device and enhance the electrical performance of the FinFET.

[Second Embodiment]

Figure 2A:
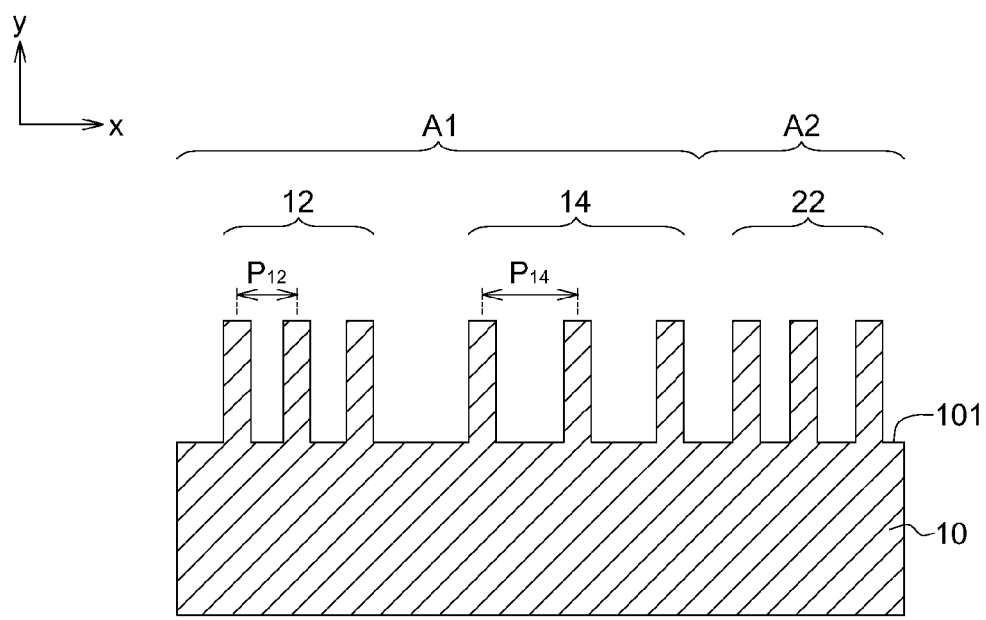
FIG. 2A~FIG. 2F illustrate a method for manufacturing a FinFET according to the second embodiment of the present disclosure.
Figure 2B:
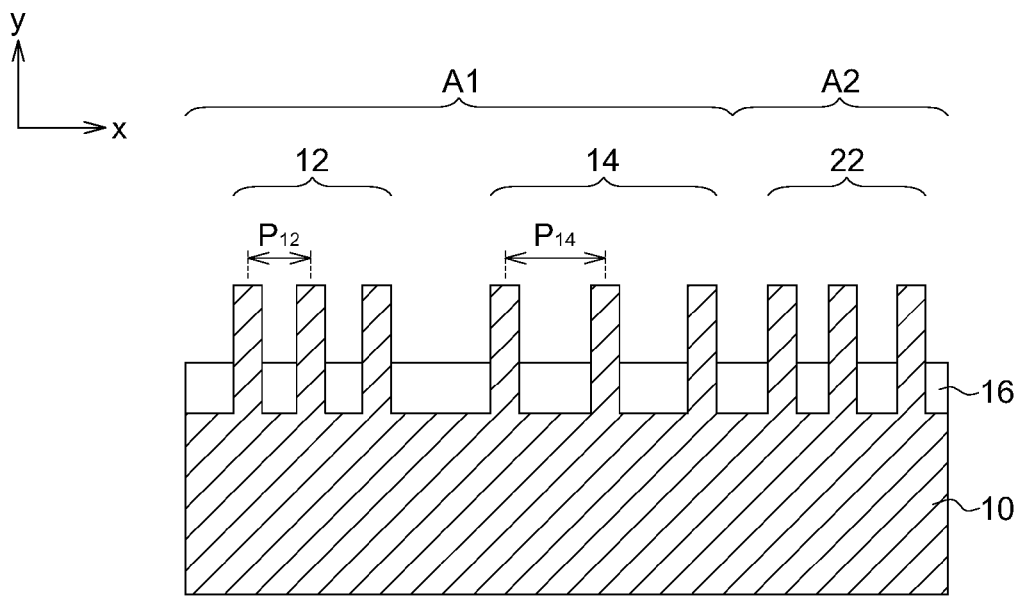
Figure 2C:
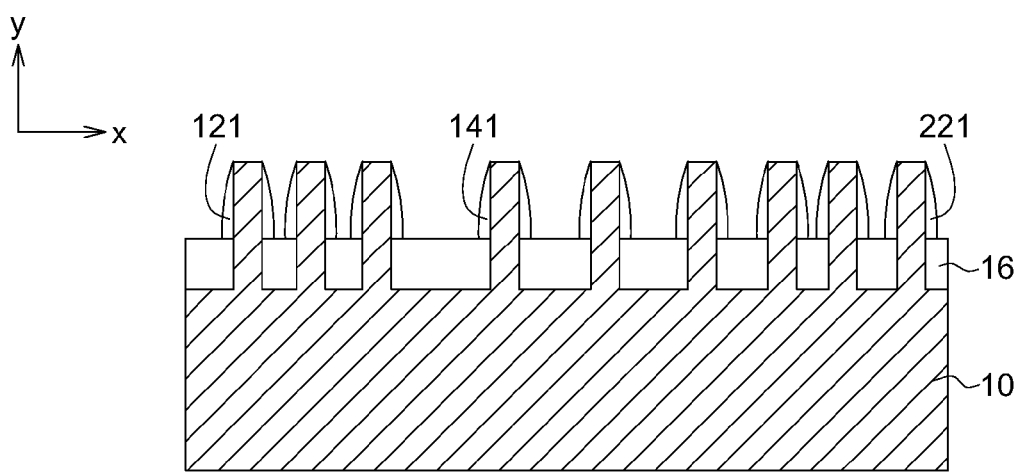

FIG. 2A~FIG. 2F illustrate a method for manufacturing a FinFET according to the second embodiment of the present disclosure. Steps of the second embodiment are similar to that of the first embodiment, except for the changing of the order of steps. The identical elements of the first and second embodiments are designated with the same reference numerals. It is noted that steps as depicted in FIG. 2A~FIG. 2C are identical to steps illustrated in FIG. 1A~FIG. 1C, FIG. 6 and FIG. 7. Please refer to the first embodiment for the descriptions of the related elements, and the details are not redundantly repeated.

In the second embodiment, no shrinking step is performed on the spacers. Also, the mask layer 18 can be removed before removing the spacers.

Figure 2D:
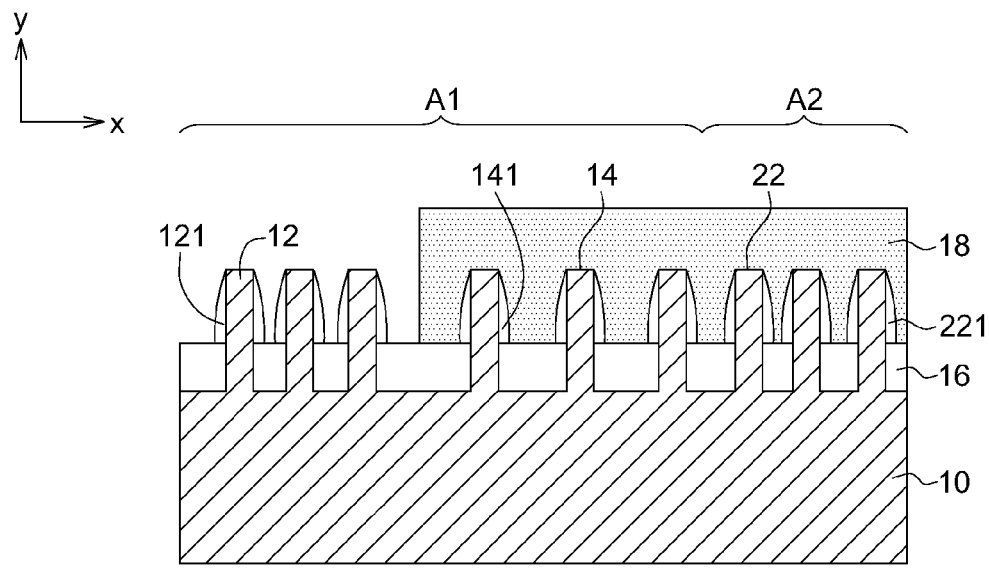

As shown in FIG. 2D, a mask layer 18 is provided for shielding the predetermined portions after forming the spacers (i.e. the first spacers 121 and 141 respectively on the sidewalls of the densely-distributed first protruding fins 12 and the loosely-distributed first protruding fins 14, and the second spacers 221 on the sidewalls of the second fins 22 in FIG. 2C). In the second embodiment, the mask layer 18 is also applied for covering not only the second fins 22 in the second area A2 but also the loosely-distributed first protruding fins 14 in the first area A1.

Figure 2E:
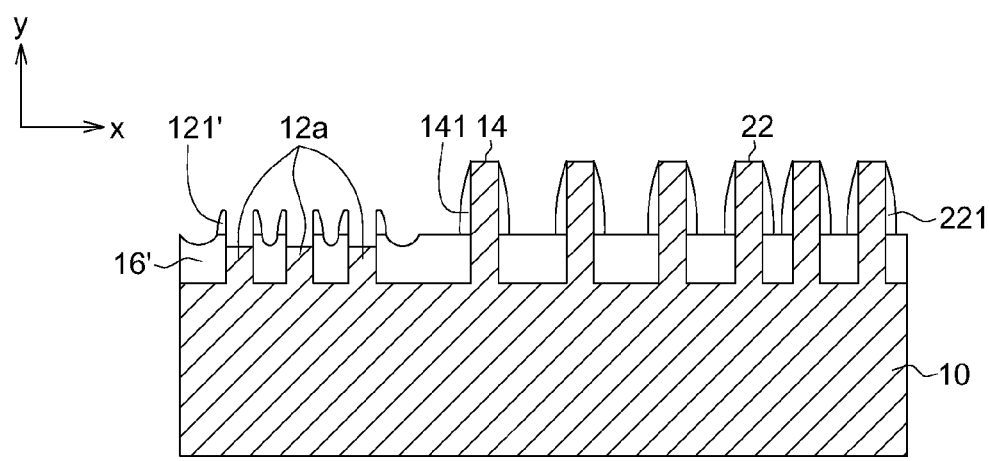
Figure 2F:
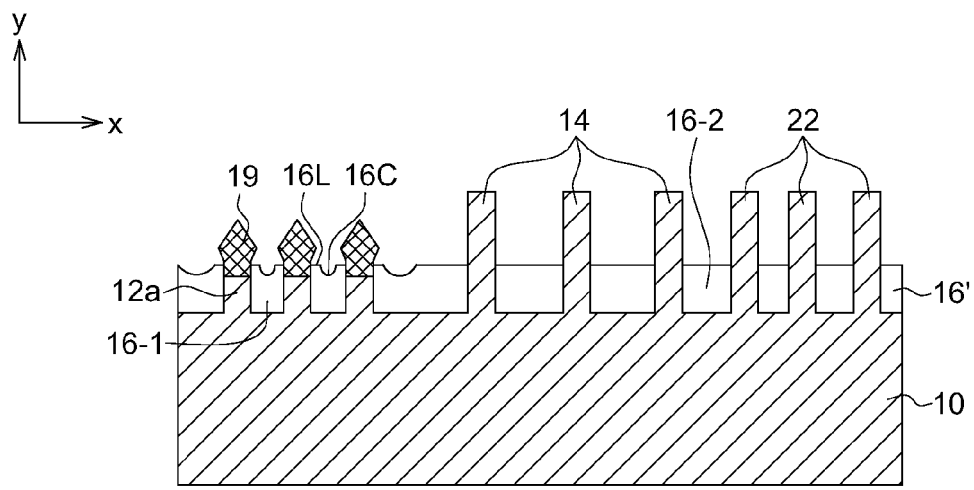

As shown in FIG. 2E, the densely-distributed first protruding fins 12 (outside the gate stacks 60) are recessed, and the insulating layer 16 is patterned simultaneously, so as to form the recessed fins 12a and the insulation 16', respectively. Afterward, the mask layer 18 is removed. An epitaxial (Epi) material is grown to form the Epi layers 19 on the recessed fins 12a, wherein the Epi layers 19 on the adjacent recessed fins 12a are spaced apart from each other, as shown in FIG. 2F.

Similarly, the spacers can be removed before or after growing the Epi layer, depending on the scheme of the practical application. In this exemplified process flow, the spacers, including the first spacers 121' and 141 on the densely-distributed first protruding fins 12 and the loosely-distributed first protruding fins 14 and the second spacers 221 on the second fins 22, are removed before growing the Epi layers 19.

[Third Embodiment]

Figure 3:
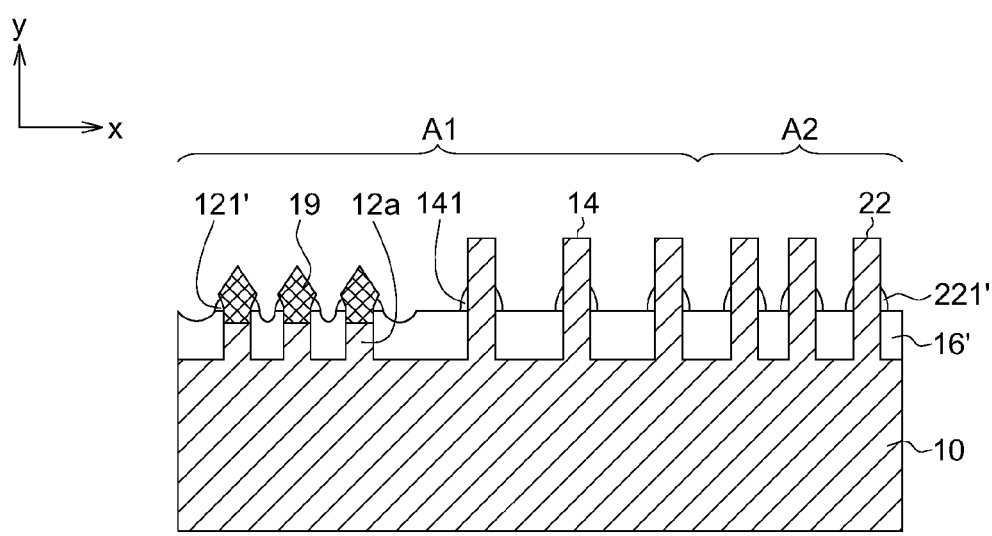
FIG. 3 illustrates a FinFET manufactured according to the third embodiment of the present disclosure.

FIG. 3 illustrates a FinFET manufactured according to the third embodiment of the present disclosure. In the third embodiment, the spacers short in height can be kept on the insulation 16' (ex: the lateral portions 16L of the first insulating regions 16-1) when the Epi layers 19 are grown. Manufacturing steps of the third embodiment can be referred to that of the first embodiment, and the details are not redundantly repeated. Identical elements of the third and the first embodiments are designated with the same reference numerals.

In one embodiment, the spacers, including the first spacers 121' and 141' on the densely-distributed first protruding fins 12 and the loosely-distributed first protruding fins 14 and the second spacers 221' on the second fins 22, can be kept on the insulation 16' if a height of the spacers is no more than 5 nm.

In an alternated embodiment, the spacers (including the first spacers 121' and 141' on the densely-distributed first protruding fins 12 and the loosely-distributed first protruding fins 14 and the second spacers 221' on the second fins 22), can be kept on the insulation 16' if the height of the spacers is about 5~30% of original height after partially shrinking the spacers.

[Fourth Embodiment]

Figure 4:
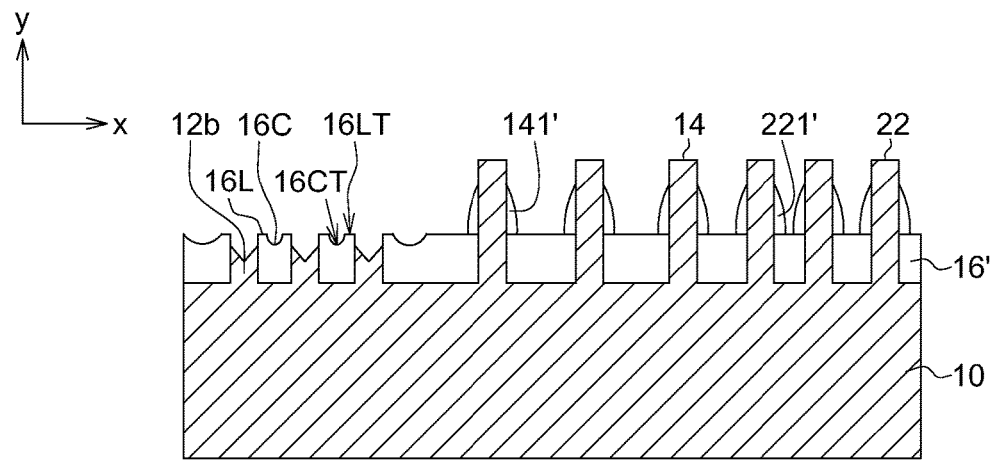
FIG. 4 illustrates a FinFET manufactured according to the fourth embodiment of the present disclosure.
Figure 5:
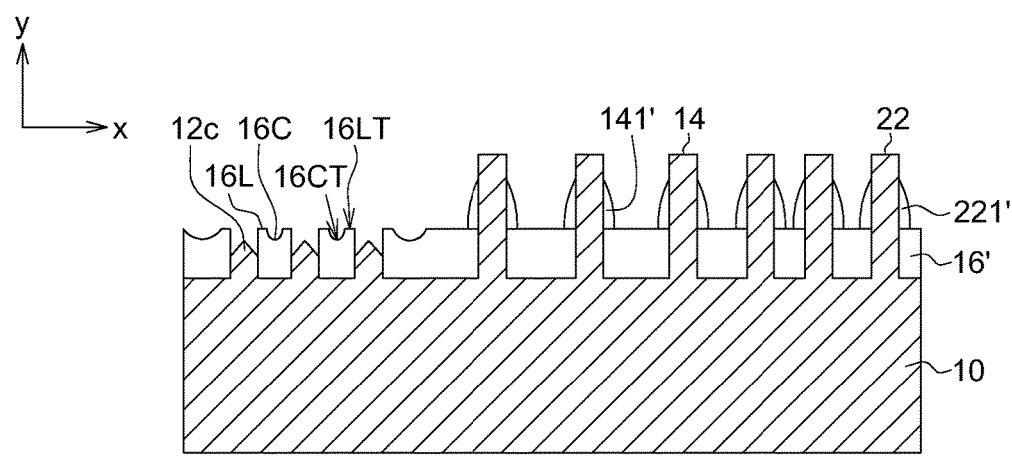
FIG. 5 illustrates another FinFET manufactured according to the fourth embodiment of the present disclosure.

FIG. 4 illustrates a FinFET manufactured according to the fourth embodiment of the present disclosure. FIG. 5 illustrates another FinFET manufactured according to the fourth embodiment of the present disclosure. Identical elements of the fourth and the first embodiments are designated with the same reference numerals. Manufacturing steps of the fourth embodiment can be referred to that of the first and second embodiments, and the details are not redundantly repeated.

Figures in the first to third embodiments depict the recessed fins 12a with flat top surfaces 12aT. However, the present disclosure is not limited thereto. The top surfaces of the recessed fins 12a can be further modified to facilitate the formation of separate Epi layers 19 on the recessed fins.

In the fourth embodiment, the recessed fins can be further patterned by adequate procedure before growing the Epi layers 19. As shown in FIG. 4, the top surface of the recessed fin 12b presents a V-shaped cross-section. As shown in FIG. 5, the top surface of the recessed fin 12c presents a reversed-V cross-section. In FIG. 4 and FIG. 5, a highest point of the recessed fin 12b or 12c is lower than the top surface 16CT of the central portion 16C of the insulation 16'. After a strain material such as a Epi material is grown, the Epi layers (not shown) on the recessed fins 12b or 12c would be spaced apart from each other.

Moreover, spacers in the different device regions of a FinFET manufactured by the embodied method can be removed partially or completely, depending on the actual needs of practical application. For example, the spacers in one device region can be removed, while the spacers in the other device region can be remained on the insulation 16' (ex: short spacers remained). Spacers in both device regions can be kept or removed completely. In one embodiment, the spacers in the PMOS device of FinFET are remained on the insulation, while the spacers in the NMOS device of FinFET are removed, and vice versa.

Although the methods of the embodiments described above are conducted in the presence of the spacers, the present disclosure is not limited thereto. In practical application, the insulation with particular profile between the recessed fins can be formed with or without the spacers.

According to the aforementioned descriptions, the FinFET of the embodiments comprises an insulation with particular profile between the recessed fins, wherein the lateral portion adjacent to the recessed fin is substantially higher than the central portion of the insulation, which facilitates the growing of the upwardly. Accordingly, the Epi layers grown on the recessed fins can be effectively spaced apart from each other for generating good strain ability, thereby increasing the carrier mobility of the device and enhance the electrical performance of the FinFET. Additionally, the methods of the embodiments are simple and can be conducted without increasing the cost of production.

Other embodiments with different configurations, such as with or without spacers, are applicable, which could be varied depending on the actual needs of the applications. It is, of course, noted that the configurations and process flows of FIG. 1A~1G, FIG. 2A~FIG. 2F, FIG. 3~FIG. 7 are depicted only for demonstration, not for limitation. It is known by people skilled in the art that the configurations and process flows could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fin field effect transistor (FinFET), comprising:
   a substrate, having a top surface, at least a shortened fin extending upwardly from the top surface of the substrate and at least a gate stack formed above the substrate, wherein the gate stack is extended perpendicularly to an extending direction of the shortened fin, and the shortened fin is outside the gate stack;
   an insulation formed on the top surface of the substrate, comprising:
      a lateral portion adjacent to the shortened fin, wherein a top surface of the lateral portion is a flat surface parallel to the top surface of the substrate; and
      a central portion contiguous to the lateral portion and farther away from the shortened fin than the lateral portion, and the top surface of the lateral portion higher than a top surface of the central portion, wherein a top surface of the shortened fin is lower than the top surface of the central portion of the insulation, and the top surface of the central portion is a concave surface;
   spacers, formed on the top surface of the lateral portion of the insulation but not formed on the top surface of the central portion, wherein the top surface of the shortened fin is lower than bottoms of the spacers formed on the lateral portion of the insulation; and
   an epitaxial (Epi) layer grown on the shortened fin and leaning against the lateral portion of the insulation.

2. The FinFET according to claim 1, wherein the substrate has a first area with a plurality of the shortened fins and a second area with a plurality of second fins, and the insulation is formed for isolating the shortened fins and the second fins.

3. The FinFET according to claim 2, wherein the insulation at least comprises a plurality of first insulating regions formed between the adjacent shortened fins at the first area, and the first insulating regions are outside the gate stack,
  wherein the top surface of the lateral portion of one of the first insulating regions is higher than the top surface of the central portion of said first insulating region, while the top surfaces of the shortened fins are lower than the top surface of the central portion of said first insulating region.

4. The FinFET according to claim 3, wherein a height of the spacers is no more than 5nm.

5. The FinFET according to claim 3, wherein the insulation further comprises a plurality of second insulating regions formed between the adjacent second fins at the second area, and the second insulating regions are outside the gate stack,
  wherein a top surface of the second insulating regions is substantially parallel to the top surface of the substrate, and higher than the top surface of the central portion of the first insulating region.

6. The FinFET according to claim 2, further comprising:
  a plurality of the epitaxial (Epi) layers grown on the shortened fins, wherein the plurality of said Epi layers on the adjacent shortened fins are spaced apart from each other.

7. The FinFET according to claim 2, wherein the first area further comprises a plurality of first protruding fins extending upwardly from the top surface of the substrate, and a pitch of the shortened fins is smaller than a pitch of the first protruding fins.

8. The FinFET according to claim 1, wherein the shortened fin has a flat top surface substantially parallel to the top surface of the substrate.

9. The FinFET according to claim 1, wherein the shortened fin has a top surface with a V-shaped cross-section, and a highest point of the shortened fin is lower than the top surface of the central portion of the insulation.

10. The FinFET according to claim 1, wherein the substrate comprises a first device region and a second device region, and the insulation formed in the first device region and the second device region, wherein the spacers are formed on the insulation in the first device region, while no spacer is formed on the insulation in the second device region.

11. The FinFET according to claim 1, wherein the substrate comprises a first device region and a second device region, and the spacers are formed on the insulation in the second device region, while no spacer is formed on the insulation in the first device region.

12. A method for manufacturing a FinFET, comprising
  providing a substrate having a top surface, at least a shortened fin extending upwardly from the top surface of the substrate, and at least a gate stack formed above the substrate, wherein the gate stack is extended perpendicularly to an extending direction of the shortened fin, and the shortened fin is outside the gate stack; and
  forming an insulation on the top surface of the substrate, the insulation comprising a lateral portion adjacent to the shortened fin, and a central portion contiguous to the lateral portion and farther away from the shortened fin than the lateral portion, wherein a top surface of the lateral portion is a flat surface parallel to the top surface of the substrate, and the top surface of the lateral portion higher than a top surface of the central portion, wherein a top surface of the shortened fin is lower than the top surface of the central portion of the insulation, and the top surface of the central portion is a concave surface;
  forming spacers on the top surface of the lateral portion of the insulation but not formed on the top surface of the central portion, wherein the top surface of the shortened fin is lower than bottoms of the spacers formed on the lateral portion of the insulation; and
  forming an epitaxial (Epi) layer on the shortened fin and leaning against the lateral portion of the insulation.

13. The method according to claim 12, wherein the substrate has a first area with a plurality of first protruding fins and a second area with a plurality of second fins, and the step of providing the substrate having at least the shortened fin at least comprises:
  forming an insulating layer on the top surface of the substrate for isolating the first protruding fins and the second fins;
  forming the gate stack on the insulating layer to overlap portions of the first protruding fins and the second fins, wherein the gate stack is extended perpendicularly to an extending direction of the first protruding fins and the second fins;
  shielding at least the second fins by a mask layer; and
  recessing a group of the first protruding fins and patterning the insulating layer, so as to form plural the shortened fins outside the gate stack and the insulation respectively.

14. The method according to claim 13, further comprising:
  removing the mask layer; and
  growing a plurality of the epitaxial layers on the shortened fins,
  wherein the plurality of said epitaxial layers on the adjacent shortened fins are spaced apart from each other.

15. The method according to claim 13, further comprising:
  forming a first group of the spacers and a second group of the spacers respectively on sidewalls of the first protruding fins and the second fins, and forming gate stack spacers on sidewalls of the gate stack before shielding the second fins.

16. The method according to claim 15, further comprising:
  shrinking the first group of the spacers and the second group of the spacers before shielding the second fins, followed by recessing the first protruding fins and patterning the insulating layer.

17. The method according to claim 15, wherein the insulation at least comprises a plurality of first insulating regions formed between the adjacent shortened fins at the first area, wherein the top surface of the lateral portion of one of the first insulating regions outside the gate stack is higher than the top surface of the central portion of said first insulating region, while the top surface of one of the shortened fins is lower than the top surface of the central portion of said first insulating region;
  after recessing the first protruding fins and patterning the insulating layer, the first group of the spacers are formed on the lateral portions of the first insulating regions.

18. The method according to claim 17, wherein the insulation further comprises a plurality of second insulating regions formed between the adjacent second fins at the second area,
  wherein a top surface of the second insulating regions outside the gate stack is substantially parallel to the top surface of the substrate, and higher than the top surface of the central portion of the first insulating region.

19. The method according to claim 17, further comprising:
- growing a plurality of the epitaxial layers on the shortened fins,
- wherein the plurality of said epitaxial layers on the adjacent shortened fins are spaced apart from each other.

20. The method according to claim 13, wherein another group of the first protruding fins in the first area are covered by the mask layer during the recessing step of forming the shortened fins, wherein a pitch of the shortened fins is smaller than a pitch of said another group of first protruding fins.

21. The method according to claim 13, further comprising:
- patterning the shortened fins, wherein a highest point of the shortened fin is lower than the top surface of the central portion of the insulation; and
- growing a plurality of the epitaxial layers on the shortened fins, wherein the plurality of said epitaxial layers on the adjacent shortened fins are spaced apart from each other.

* * * * *